(12) United States Patent
Moon

(10) Patent No.: US 8,199,589 B2
(45) Date of Patent: Jun. 12, 2012

(54) SHIFT REGISTER PROVIDING GLITCH FREE OPERATION IN POWER SAVING MODE

(75) Inventor: Yong-Sam Moon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 303 days.

(21) Appl. No.: 12/706,168

(22) Filed: Feb. 16, 2010

(65) Prior Publication Data

US 2010/0214854 A1 Aug. 26, 2010

(30) Foreign Application Priority Data

Feb. 23, 2009 (KR) ........................ 10-2009-0014836

(51) Int. Cl.
*G11C 7/00* (2006.01)

(52) U.S. Cl. .............................. 365/189.14; 365/233.13

(58) Field of Classification Search ............. 365/189.14, 365/233.13
See application file for complete search history.

(56) References Cited

U.S. PATENT DOCUMENTS

| 5,568,100 A | 10/1996 | Locanthi |
| 7,456,674 B2 * | 11/2008 | Oakland ....................... 327/291 |
| 2001/0038565 A1 * | 11/2001 | Matsuzaki ..................... 365/222 |
| 2005/0281112 A1 * | 12/2005 | Ito et al. ....................... 365/222 |

FOREIGN PATENT DOCUMENTS

| KR | 100252063 B1 | 1/2000 |
| KR | 1020040031532 A | 4/2004 |

* cited by examiner

*Primary Examiner* — Michael Tran
(74) *Attorney, Agent, or Firm* — Volentine & Whitt, PLLC

(57) ABSTRACT

Disclosed is a shift register including a plurality of flip-flops configured in series to shift input data in response to an applied clock, and a drive operation controller. The drive operation controller includes; a first logic gate configured to receive and logically combine selected outputs from selected ones of the plurality of flip-flops to generate a gate output signal, a drive operation controller flip-flop configured to receive the gate output signal and retime the gate output signal in response to a first clock applied to a clock terminal of a first flip-flop in the plurality of flip-flops to generate a clock enable signal, an inverter configured to receive the clock enable signal and generate an inverted clock enable signal, and a second logic gate configured to receive and logically combine the first clock and the inverted clock enable signal to generate a second clock, wherein the second clock signal is applied to a clock terminal of at least one later stage flip-flop following the first flip-flop in the plurality of flip-flops.

18 Claims, 18 Drawing Sheets

SHIFT REGISTER PROVIDING GLITCH FREE OPERATION IN POWER SAVING MODE

CROSS-REFERENCE TO RELATED APPLICATIONS

A claim of priority under 35 U.S.C. §119 is made to Korean Patent Application 10-2009-0014836 filed Feb. 23, 2009, the subject matter of which is hereby incorporated by reference.

BACKGROUND

The present inventive concept relates generally to shift register circuits. More particularly, the inventive concept relates to a shift register adapted for use within a semiconductor memory device such as a dynamic random access memory (DRAM) or the like.

The DRAM is one type of volatile memory including a great plurality of memory cells. Each memory cell is implemented with one access transistor and a corresponding storage capacitor. Because the DRAM is volatile in its data storage capabilities, a refresh operation must be applied to the memory cells. The DRAM is commonly used as a main memory within an electronic system because it provides high data access (read/write) speeds and may be very densely integrated to yield a large capacity memory in a relatively small size.

High-performance DRAMs provide improved operating speed, and include the Synchronous DRAM (SDRAM), the Double Data Rate (DDR) SDRAM, and the Fast Cycle RAM (FCRAM). Of these, the SDRAM enables clock synchronous data access at the rising edge or falling edge of the controlling clock. In contrast, the DDR SDRAM enables clock synchronous data access at both the rising and falling edges of the clock. So, in general, the DDR SDRAM operates at a data transmission rate twice (2×) that of an analogous SDRAM.

Many types of semiconductor memory devices, including the SDRAM, DDR SDRAM and/or FCRAM, commonly incorporate a shift register implemented by a plurality of flip-flops. The shift register is used to provide circuit defining a write latency (WL) and/or a read latency (RL).

Because operation of the shift register (i.e., the plurality of flip-flops) consumes significant power, some power-saving modes of operation (e.g., a power-down mode, sleep mode, wait mode, etc.) for the constituent semiconductor memory device reduce power consumption by turning off a controlling (or toggling) clock applied to the plurality of flip-flops. However, it is important to note that if input data is applied to the shift register during a power-saving mode, the toggling clock must immediately be restored. This re-application of the toggling clock is typically accomplished by having the semiconductor memory device enter an active mode of operation (e.g. a wake-up mode).

Of further note, the transition between a power-saving mode and an active mode may cause stray or errant flip-flop toggling or ill-clocked data shifts (hereafter, generically referred to a "glitch") within the shift register. Such "glitching" can generate erroneous control signals or control signal timing during a data access operation. Therefore, it is important to prevent the generation of a glitch in the operation of the shift register. In other words, when a glitch occurs in the clock controlling operation of the shift register, it is difficult to properly shift data. Thus, it is highly desirable to provide a shift register capable of a glitch-free operation even when said shift register transitions between power-saving and active modes of operation.

SUMMARY

Embodiments of the inventive concept provide a shift register capable of glitch free operation when transitioning between a power saving mode and an active mode of operation. Thus, embodiments of the inventive concept provide a shift register capable of operating in a power saving mode while still generating a glitch-free clock as the constituent shift clock.

One embodiment of the inventive concept provides a shift register capable of operating in a power-saving mode or an active mode, and comprising; a shift register including a plurality of flip-flops configured in series to shift input data in response to an applied clock, and a drive operation controller. The drive operation controller comprises; a first logic gate configured to receive and logically combine selected outputs from selected ones of the plurality of flip-flops to generate a gate output signal, a drive operation controller flip-flop configured to receive the gate output signal and retime the gate output signal in response to a first clock applied to a clock terminal of a first flip-flop in the plurality of flip-flops to generate a clock enable signal, an inverter configured to receive the clock enable signal and generate an inverted clock enable signal, and a second logic gate configured to receive and logically combine the first clock and the inverted clock enable signal to generate a second clock, wherein the second clock signal is applied to a clock terminal of at least one later stage flip-flop following the first flip-flop in the plurality of flip-flops.

In a related aspect, the at least one later stage flip-flop includes a last flip-flop series connected within the plurality of flip-flops.

In another related aspect, the first logic gate is a first OR gate and the selected outputs exclude a last output from the last flip-flop.

In another related aspect, the first logic gate is a first OR gate and the selected outputs include outputs from each one of the plurality of flip-flops except the last output from the last flip-flop.

In another related aspect, the shift register further comprises an additional flip-flop series connected in front of the first flip-flop and configured to pass the input data to the first flip-flop, wherein the first logic gate is a first OR gate receiving as input selected outputs from the plurality of flip-flops, excluding a last output from a last flip-flop series connected within the plurality of flip-flops, and the input data.

In another related aspect, each one of the plurality of flip-flops operates on a rising-edge of the applied clock.

In another related aspect, each one of the plurality of flip-flops operates on a falling-edge of the applied clock.

In another related aspect, the second logic gate is a second OR gate.

In another related aspect, the second logic gate is an AND gate.

In another embodiment, the inventive concept provides a semiconductor memory device comprising; a memory cell array having a plurality of memory cells in a matrix of rows and columns, a read and write circuit configured to read data from the memory cells and write data to the memory cells, and a latency control circuit configured to control read latency for the read circuit and write latency for the write circuit when operating in a power-saving mode or an active mode. The latency control circuit comprises a shift register including a plurality of flip-flops configured in series to shift input data in response to an applied clock, and a drive operation controller as described above.

BRIEF DESCRIPTION OF THE DRAWINGS

The inventive concept will become more fully understood from the detailed description given hereinbelow and with reference to the accompanying drawings which are given by way of illustration.

DETAILED DESCRIPTION OF EMBODIMENTS

Embodiments of a shift register capable of glitch free operation in a power saving mode according to the inventive concept will be described with reference to the accompanying drawings.

This inventive concept may, however, be embodied in many different forms and should not be construed as being limited to only the illustrated embodiments. Rather these embodiments are provided so that this disclosure will be thorough and complete, and will fully convey the inventive scope to those skilled in the art. The detailed description that follows is drawn to an example that assumes a working knowledge of a conventional dynamic random access memory (DRAM). Thus, wholly conventional internal circuits and their operation, including conventional operation of a D-flip-flop and shift register, for the exemplary DRAM will not be described herein. That is, only relevant distinctions between conventional operating approaches and conventional circuits and certain embodiments of the inventive concept are described below. As a descriptive predicate, a conventional example will now be described with reference to FIGS. 1 though 4.

FIGS. 1 through 4 are circuit block diagrams and related timing diagrams for a conventionally implemented and operated shift register.

Figure 1:
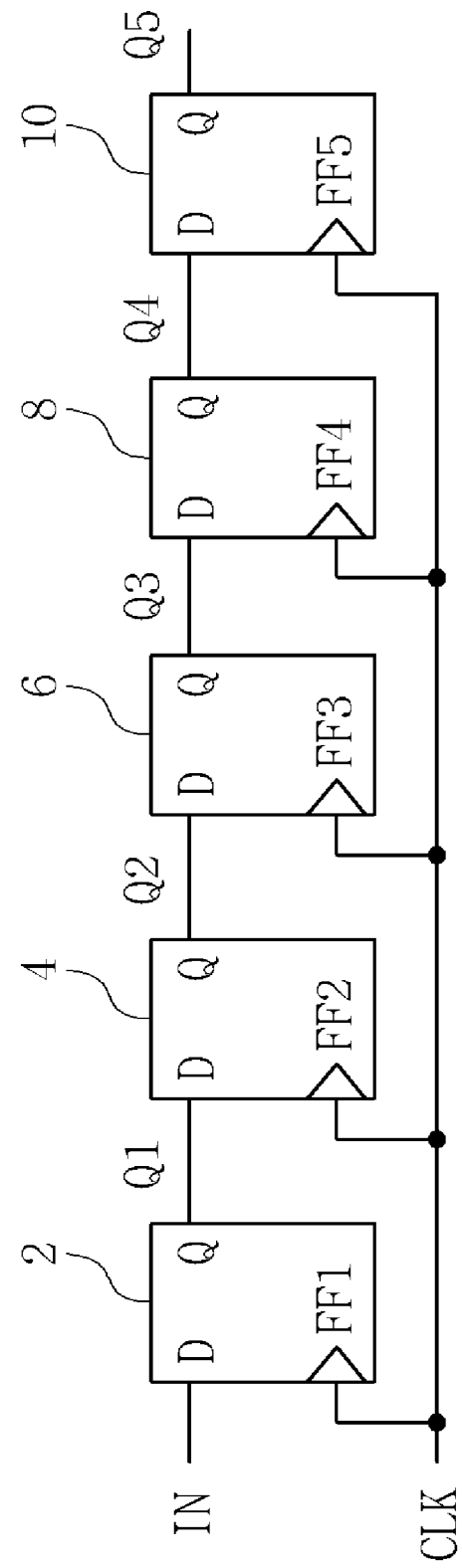
FIGS. 1 though 4 are circuit block diagrams and related timing diagrams for a conventionally designed and operated shift register.
Figure 3:
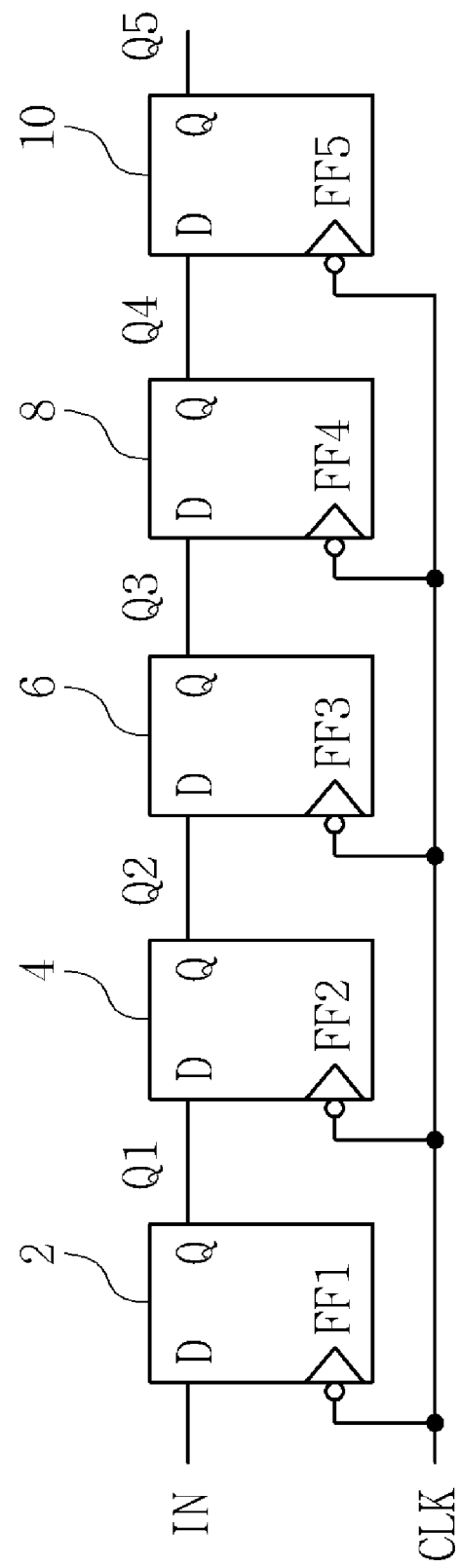

FIG. 1 is a circuit diagram of a shift register based on rising-edge triggered flip-flops. FIG. 3 is a circuit diagram of a shift register based on falling-edge triggered flip-flops.

Figure 2:
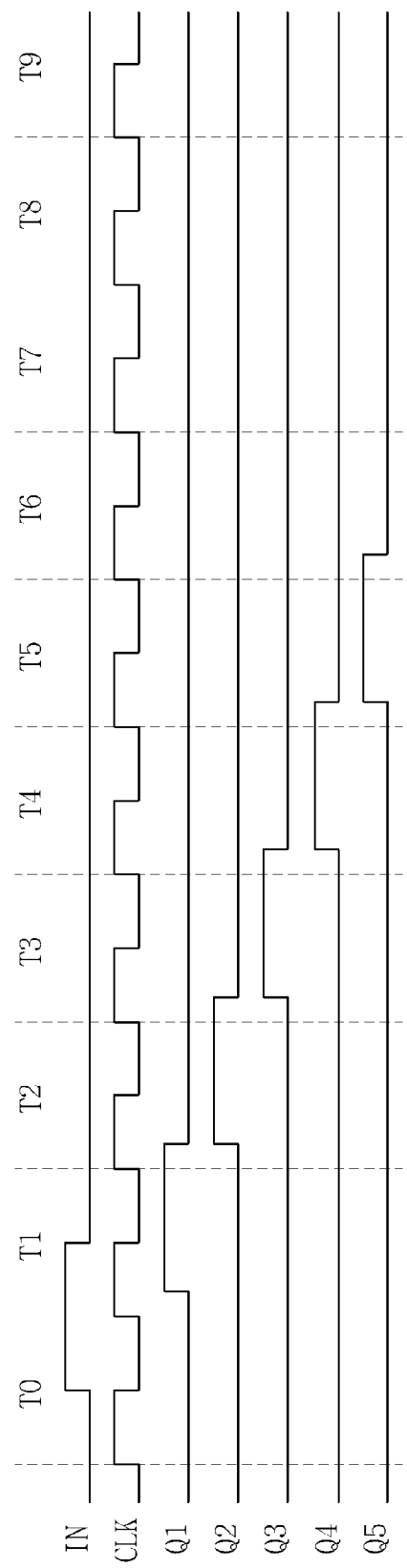
Figure 4:
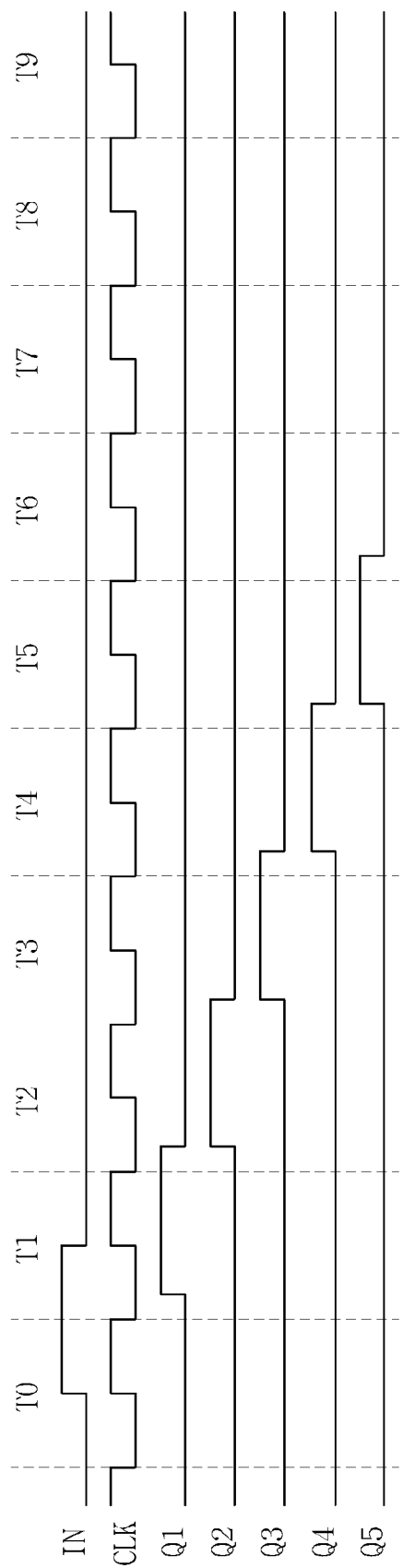

FIG. 2 is a timing diagram corresponding to FIG. 1. FIG. 4 is a timing diagram corresponding to FIG. 3. For illustration, in FIGS. 1 and 3, five flip-flops are connected to each other, but a different number of flip-flops may be used according to design requirements.

Referring to FIG. 1, the shift register receives input data IN and sequentially generates outputs of Q1 to Q5 at a logically high level (hereafter, "H"). One or more of the first through fifth outputs Q[1:5] may be used as an output of the shift register depending on the desired latency.

Of note, when input data IN is no longer passing through a particular flip-flop (2, 4, 6, 8, and 10) and its output Q[1:5] remains at a logically low level (hereafter, "L") (see, e.g., the time period extending from T6 to T9 in FIG. 2), the respective clocks applied to the flip-flops continue to toggle and this toggling effect causes continuous power consumption. Accordingly, it can be seen that, if a frequency with which input data IN is changed from "L" to "H" (or from "H" to "L") is low, unnecessary power consumption may occur.

A memory application such as an SDRAM requires low power consumption, so it is necessary to include a power-saving mode in order to reduce power consumption in the shift register.

The configuration of the shift register may be made such that when input data IN is no longer applied, the shift register is placed in the power-saving mode, and when then when the input data IN is reapplied, the shift register is placed in the active mode. However, even though a power-saving mode is added to the operation of the conventional shift register, the output waveforms shown in FIGS. 2 and 4 should not change. To this end, when the operating mode is changed between the power-saving mode and the active mode, no glitch should occur in the clock applied to the clock terminals of the flip-flops. This is because, when a glitch occurs in the clock, data is unlikely to be properly shifted.

Figure 5:
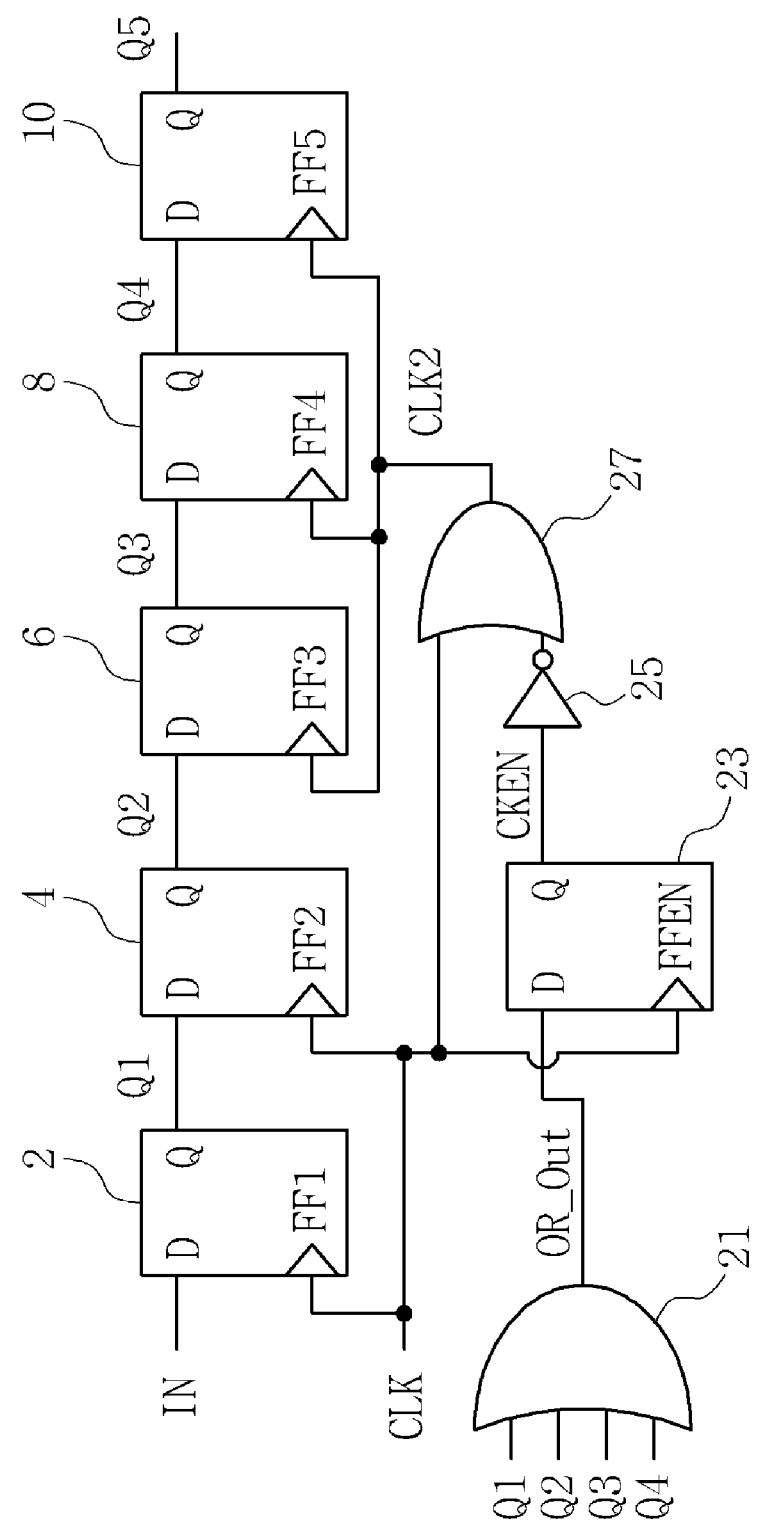
FIGS. 5 through 11 are circuit block diagrams and related timing diagrams for a shift register according to one embodiment of the inventive concept.

Accordingly, one embodiment of the inventive concept provides a shift register circuit shown in FIG. 5. The shift register circuit of FIG. 5 comprises a drive operation controller that provides glitch-free operation of the shift register circuit capable of operating in both a power-saving mode (e.g., a power-down mode) and an active mode (e.g., a wake-up mode). The drive operation controller in the illustrated embodiment comprises a first OR gate 21, a drive operation controller flip-flop 23, an inverter 25, and a second OR gate 27.

The drive operation controller obtains a gating result signal OR_Out by gating the outputs of flip-flops 2, 4, 6, and 8, generates a second clock CLK2 by using the gating result signal OR_Out, and then provides the second clock to selected ones (6, 8, and 10) of the plurality of flip-flops as a clock.

FIGS. 5 through 11 are circuit block diagrams and related timing diagrams for shift register according to an embodiment of the inventive concept.

Referring to FIG. 5, the first OR gate 21 receives first, second, third and fourth outputs Q[1:4] of first, second, third, and fourth flip-flops 2, 4, 6, and 8 as inputs, and generates the OR gate output signal OR_Out. The OR gate output OR_Out is output through the output terminal of the first OR gate 21 and applied to an input terminal D of the drive operation controller flip-flop 23. The drive operation controller flip-flop 23 retimes the OR gate output OR_Out with a first clock CLK applied to a clock terminal thereof so as to generate a clock enable signal CKEN. The inverter 25 inverts the clock enable signal CKEN so as to generate an inverted clock enable signal CKEN_b. The second OR gate 27 performs an OR operation on the inverted clock enable signal CKEN_b and the first clock CLK so as to obtain the second clock CLK2 as a new clock. The second clock CLK2 is used as a new triggering clock for the later stage flip-flops 6, 8, and 10. The embodiment of FIG. 5 shows a case where the first OR gate 21 receives the first, second, third and fourth outputs Q[1:4] and generates the OR gate output OR_Out, but when no problem arises even if an unnecessary toggling period is included in the second clock CLK2, the first OR gate 21 may receive the first through fifth outputs Q[1:5] in order to generate the OR gate output OR_Out.

There are two reasons why the OR gate output OR_Out is retimed with the clock applied to the clock terminal so as to generate the clock enable signal CKEN.

First, there is a relation between the sum of the clock-to-q delay (tCLK2Q) of the flip-flops 2, 4, 6, and 8 and the gate delay (td_OR1) of the first OR gate 21. Prior to specific description, it is assumed that tCLK2Q of respective flip-flops is smaller than 0.5×tCLK. Here, tCLK is one cycle of the clock. Mostly, the condition "tCLK2Q<0.5×tCLK" is easily satisfied.

Figure 6:
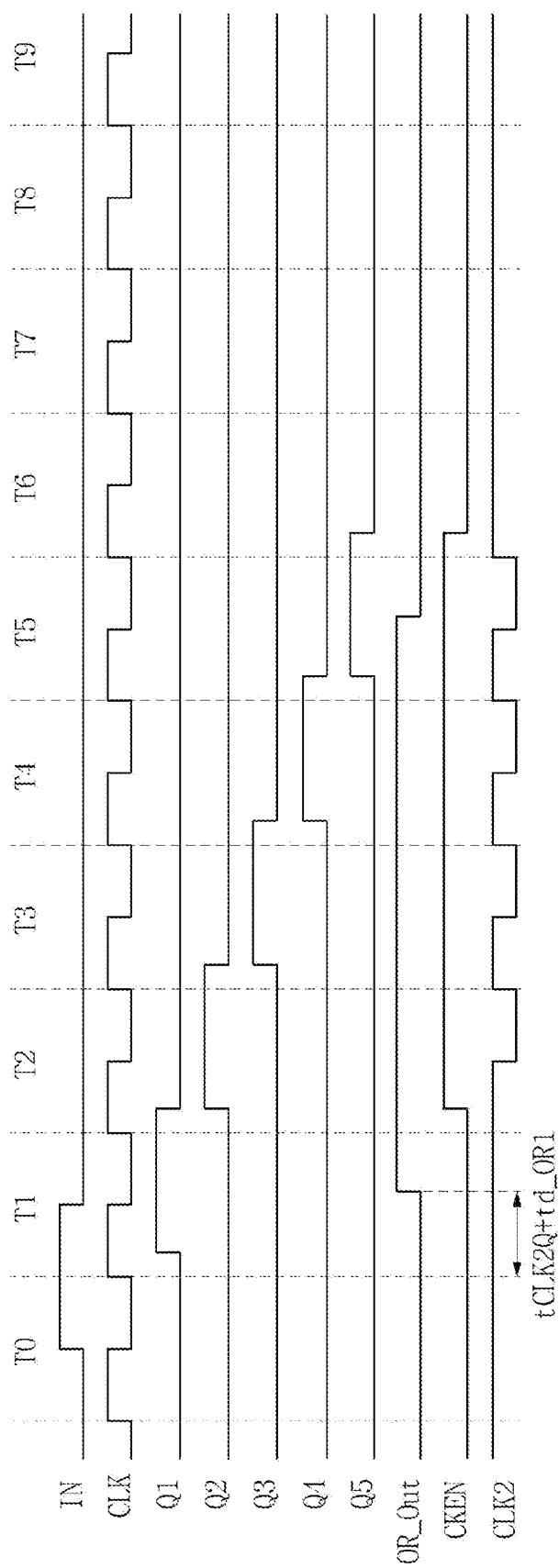
Figure 11:
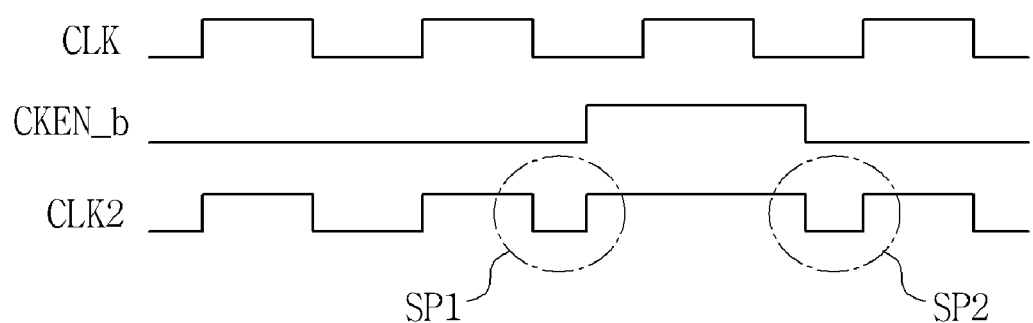

As shown in FIG. 6, the OR gate output OR_Out provided by the first OR gate 21 is changed after "tCLK2Q+td_OR1" from the rising edge of the clock CLK. Although in FIG. 5, an example where the number of inputs to the first OR gate 21 is 4 has been shown, the number of inputs of the first OR gate 21 may increase depending on the number of flip-flops used to implement the shift register. Thus, the condition "tCLK2Q+td_OR1>0.5×tCLK" may be established. In this case, if the OR gate output OR_Out is directly connected to the clock enable signal CKEN, as shown in FIG. 11, a glitch may occur in the second clock CLK2. In contrast, if the OR gate output OR_Out is retimed with the clock CLK applied to the clock terminal FFEN, the clock enable signal CKEN is changed within "0.5×tCLK" from a rising edge of the clock CLK, such that no glitch occurs.

Second, it is not preferable to directly connect the OR gate output OR_Out to the clock enable signal CKEN even when the condition "tCLK2Q+td_OR1<0.5×tCLK" is satisfied. A glitch is highly likely to be included in the OR gate output OR_Out, so it is preferable to retime the OR gate output OR_Out and to use the clock enable signal CKEN with no glitch.

While input data IN is applied to the shift register and passes through the series connected flip-flops, the second clock CLK2 is toggled. After data has passed through the flip-flops, the second clock CLK2 stops toggling. As described above, even when the power-saving mode is added, the timing relationship between the outputs of the shift register does not change. That is, referring to the timing diagram of FIG. 6, the waveforms of input data IN, the clock CLK, and the first to fifth outputs Q[1:5] are identical to the waveforms of FIG. 2.

Figure 7:
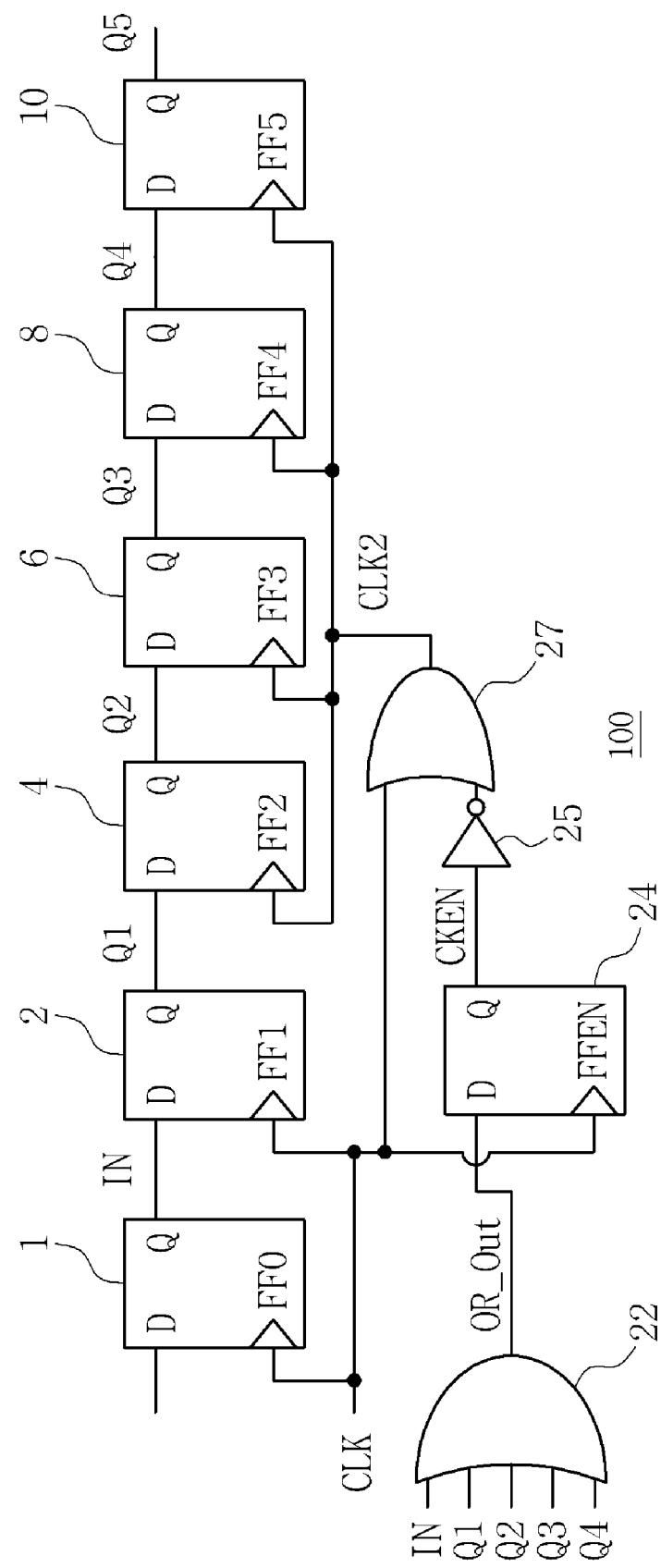
Figure 8:
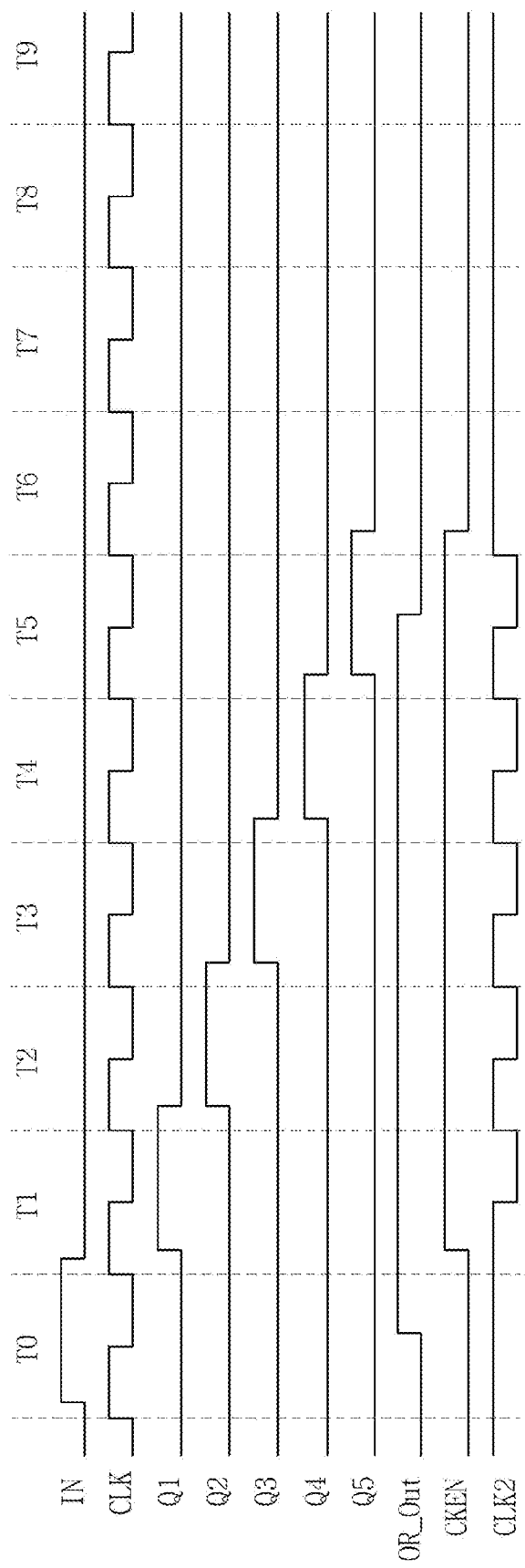

If input data IN has already been retimed with the clock CLK, as shown in FIG. 7, input data IN is added as an input of the first OR gate 22, and the flip-flop 4 and subsequent later stage flip-flops may be driven with the second clock CLK2. The shift register in FIG. 7 comprises a drive operation controller 100 that provides glitch-free operation. If the shift register is configured as shown in FIG. 7, power consumption may be further reduced. In the embodiment of the inventive concept shown in FIG. 7, an additional flip-flop 1 that outputs input data IN is connected in front of the first flip-flop 2. FIG. 8 shows the related operational timing of the circuit shown in FIG. 7.

Figure 9:
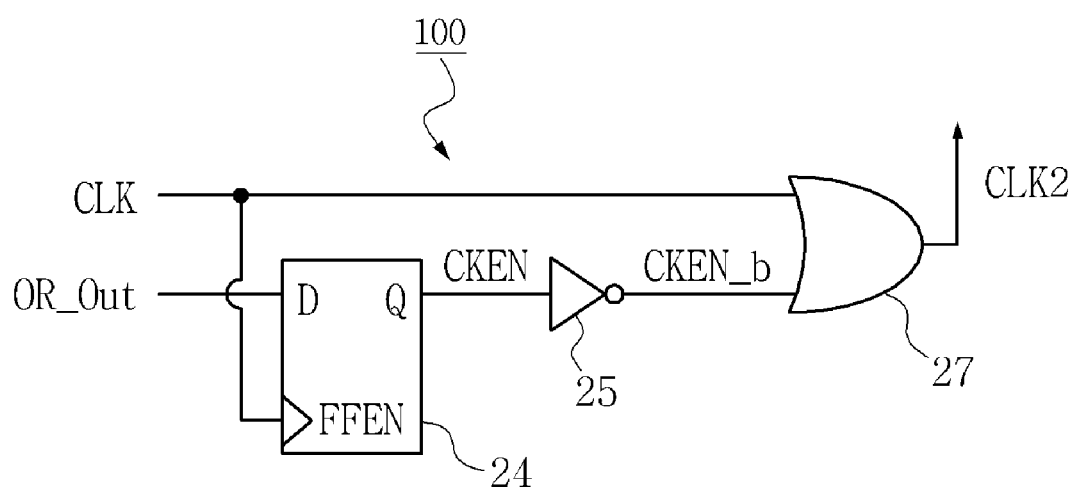
Figure 10:
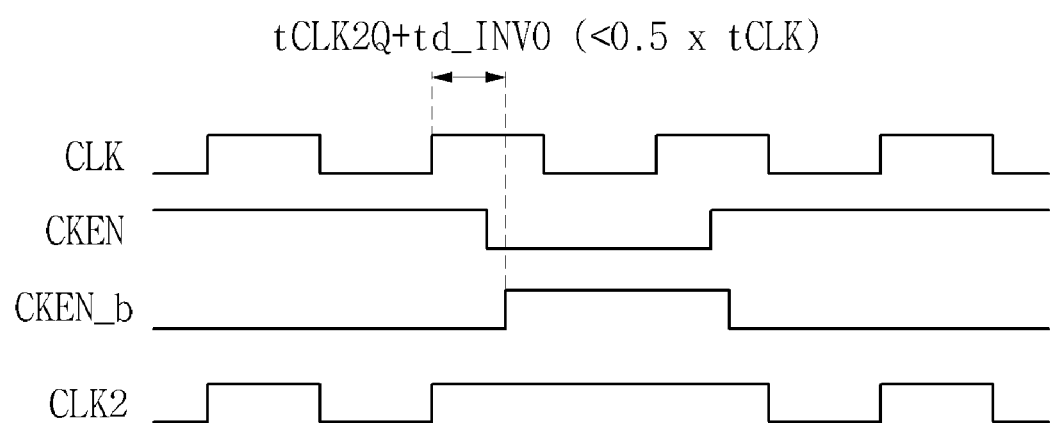

FIGS. 9, 10 and 11 are diagrams specifically illustrating a glitch-free clock gating scheme that may be used within the embodiments of FIGS. 5 and 7.

The clock enable signal CKEN that is an output of an output terminal Q of the drive operation controller flip-flop 24 in FIG. 9 passes through the inverter 25 and becomes an inverted clock enable signal CKEN_b. In this case, it is assumed that the sum of the clock-to-q (tCLK2Q) of the clock applied to the clock terminal FFEN of the flip-flop 24 and the gate delay (td_INV0) of the inverter 25 is smaller than 0.5×tCLK. If the condition "tCLK2Q+td_INV0<0.5×tCLK" is satisfied, change in the inverted clock enable signal CKEN_b constantly occurs only during a period in which the clock CLK is at "H". Even when one of the two inputs to the second OR gate 27 is "H", the output of the second OR gate 27 is "H", so when the clock CLK is "H", the second clock CLK2 is maintained at "H" regardless of the logical state of the inverted clock enable signal CKEN_b. Further, during a period in which the inverted clock enable signal CKEN_b is "H", the second clock CLK2 is constantly maintained at "H".

Consequently, if the circuit is configured as shown in FIG. 9 and the condition "tCLK2Q+td_INV0<0.5×tCLK" is satisfied, as shown in FIG. 10, glitch-free clock gating is possible.

As indicated by SP1 and SP2 in FIG. 11, if the inverted clock enable signal CKEN_b is changed during a period in which the clock CLK is "L", an undesired short pulse, that is, a glitch occurs in the second clock CLK2. In contrast, if the circuit is configured as shown in FIG. 9 and the condition "tCLK2Q+td_INV0<0.5×tCLK" is satisfied, as shown in FIG. 10, no glitch occurs.

FIGS. 12 through 18 are circuit block diagrams and related timing diagrams for shift register according to another embodiment of the inventive concept.

Figure 12:
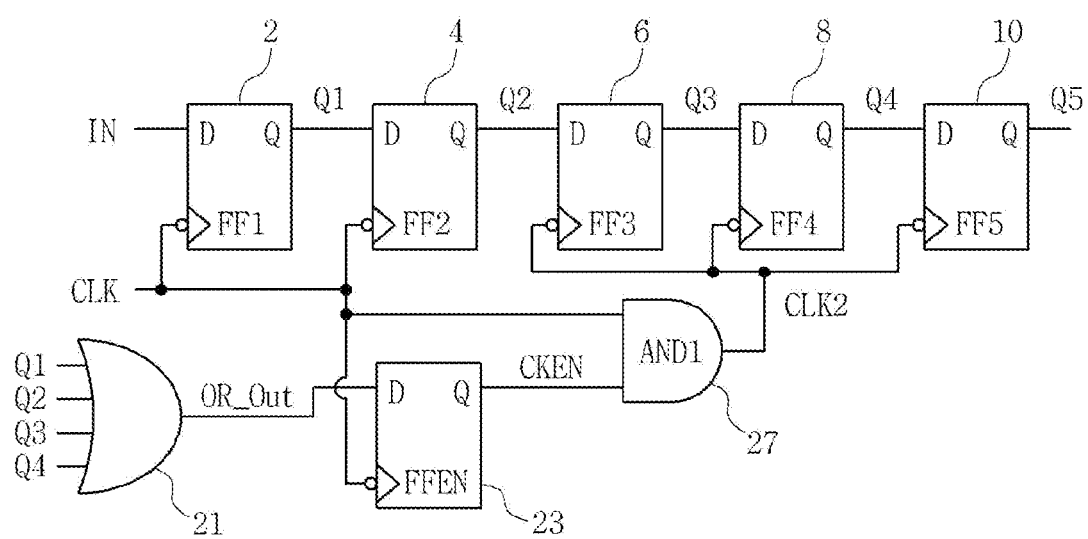
FIGS. 12 through 18 are circuit block diagrams and related timing diagrams for a shift register according to another embodiment of the inventive concept.
Figure 13:
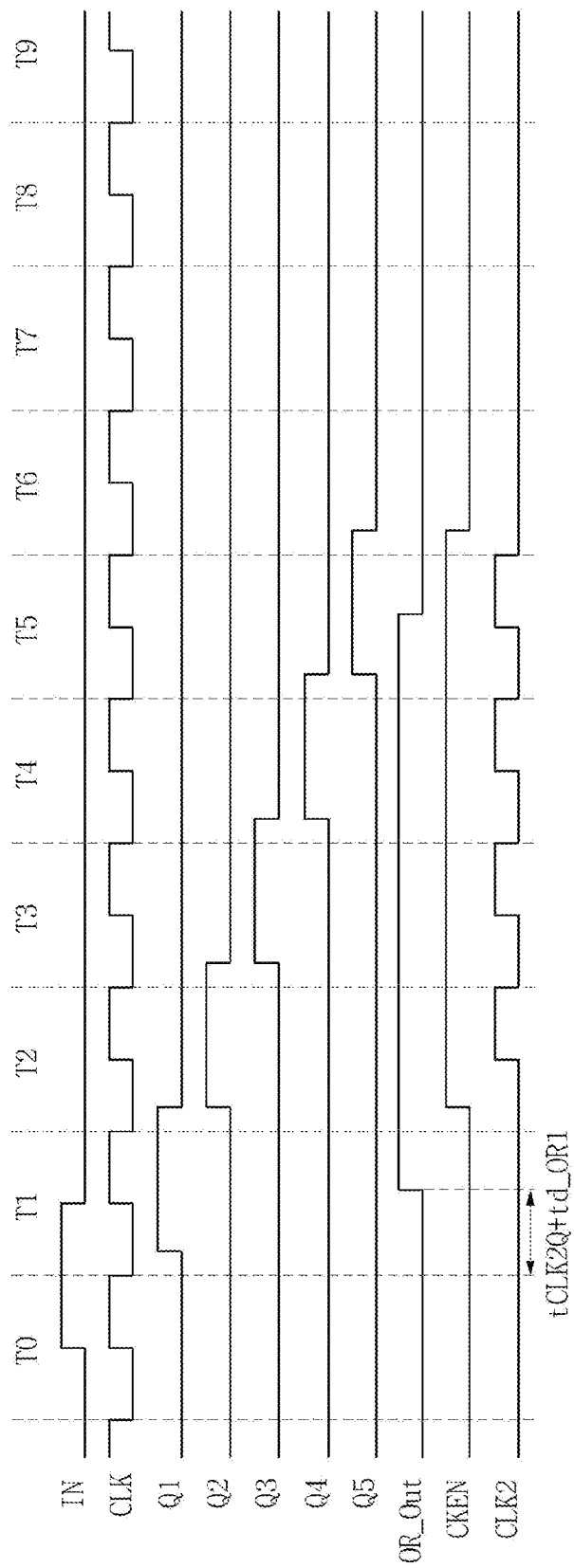

FIG. 12 shows a case where a shift register based on falling-edge triggered flip-flops is provided with a power-down mode. A first OR gate 21 performs an OR operation for the first to fourth outputs Q[1:4] so as to generate an OR gate output OR_Out. A drive operation controller flip-flop 23 retimes the OR output OR_Out with the clock CLK applied to a clock terminal FFEN so as to generate a clock enable signal CKEN. An AND gate 27 receives the clock enable signal CKEN and the clock CLK, and generates an AND response. The AND response becomes a second clock CLK2. The timing relationship is shown in FIG. 13.

The second clock CLK2 is used as a triggering clock of third, fourth, and fifth flip-flops 6, 8, and 10. There are two reasons why the OR output OR_Out is retimed with the clock applied to the clock terminal FFEN so as to generate the clock enable signal CKEN.

Figure 18:
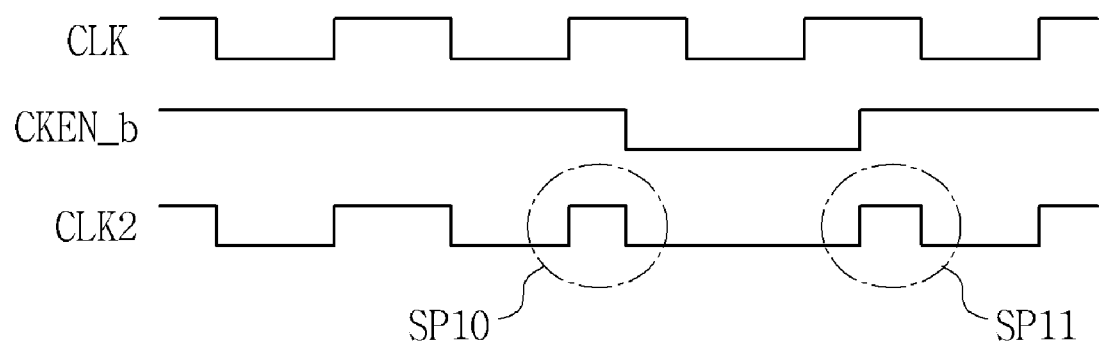

First, there is a relation with the sum of the clock-to-q delay (tCLK2Q) of each of the first to fourth flip-flops 2, 4, 6, and 8 and the gate delay (td_OR1) of the OR gate 21. It is assumed that tCLK2Q of the respective flip-flops in FIG. 12 is smaller than 0.5×tCLK. Here, tCLK means one cycle of the clock. Mostly, the condition "tCLK2Q<0.5×tCLK" is easily satisfied. As shown in the timing diagram of FIG. 13, it can be seen that the OR output OR_Out is changed after "tCLK2Q+td_OR1" from the falling edge of the clock CLK. Although in FIG. 12, an example where the number of inputs of the first OR gate 21 is 4 has been shown, the number of inputs increases depending on the number of flip-flops actually constituting the shift register. Thus, the condition "tCLK2Q+td_OR1>0.5×tCLK" may be satisfied. In this case, if the OR output OR_Out is directly connected to the clock enable signal CKEN, as shown in FIG. 18, a glitch may occur in the second clock CLK2. In contrast, if the OR output OR_Out is retimed with the clock CLK, the clock enable signal CKEN is changed within "0.5×tCLK" from the falling edge of the clock CLK, such that no glitch occurs in the second clock CLK2.

Second, it is not preferable to directly connect to the OR output OR_Out to the clock enable signal CKEN even when the condition "tCLK2Q+td_OR1<0.5×tCLK" is satisfied. A glitch is highly likely to be included in the OR output OR_Out, so it is preferable to retime the OR output to obtain the clock enable signal CKEN with no glitch.

Consequently, while input data IN is applied to the shift register and sequentially passes through a plurality of flip-flops, the second clock CLK2 is toggled. After data has passed through the flip-flops, the second clock CLK2 stops to be toggled. As described above, even though the power-down mode is added, the timing relationship between the outputs of the shift registers has no change. Referring to the timing diagram of FIG. 13, it can be seen that the waveforms of input data IN, the clock CLK, and the first to fifth outputs Q[1:5] are identical to the waveforms of FIG. 4.

Figure 14:
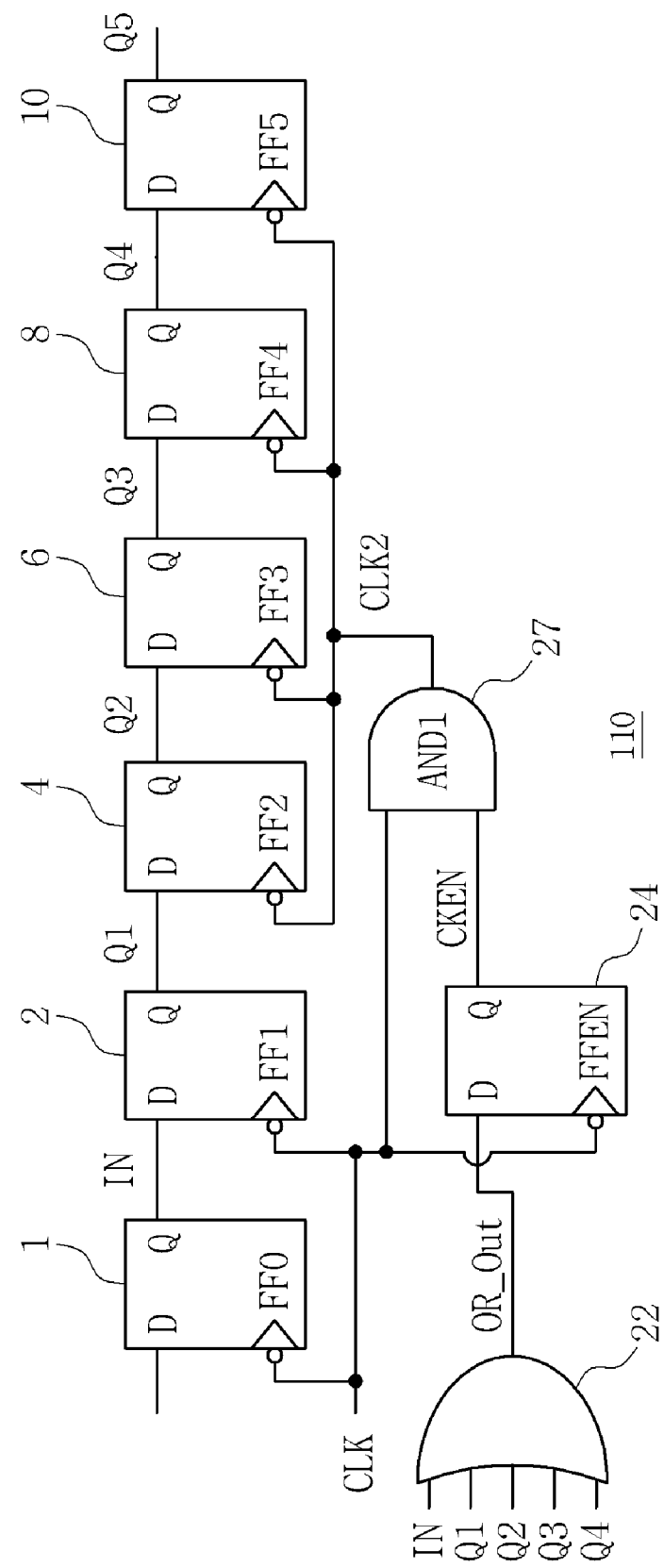
Figure 15:
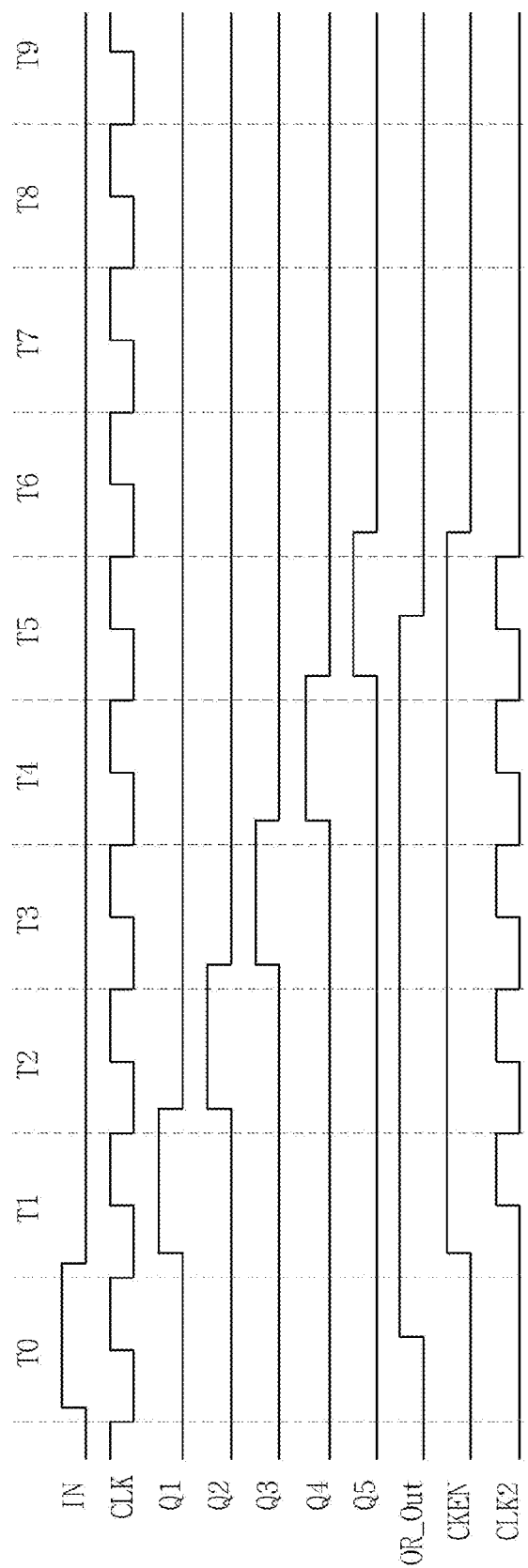

If input data IN has already been retimed with the clock CLK, as shown in FIG. 14, input data IN is added as an input of the first OR gate 22. The shift register in FIG. 14 comprises a drive operation controller 110 that provides glitch-free operation. In this case, the second flip-flop 4 to the fifth flip-flop 10 can be driven with the second clock CLK2. With this configuration, the number of flip-flops that are controlled in the power-down mode increases, so power consumption can be further reduced.

Figure 16:
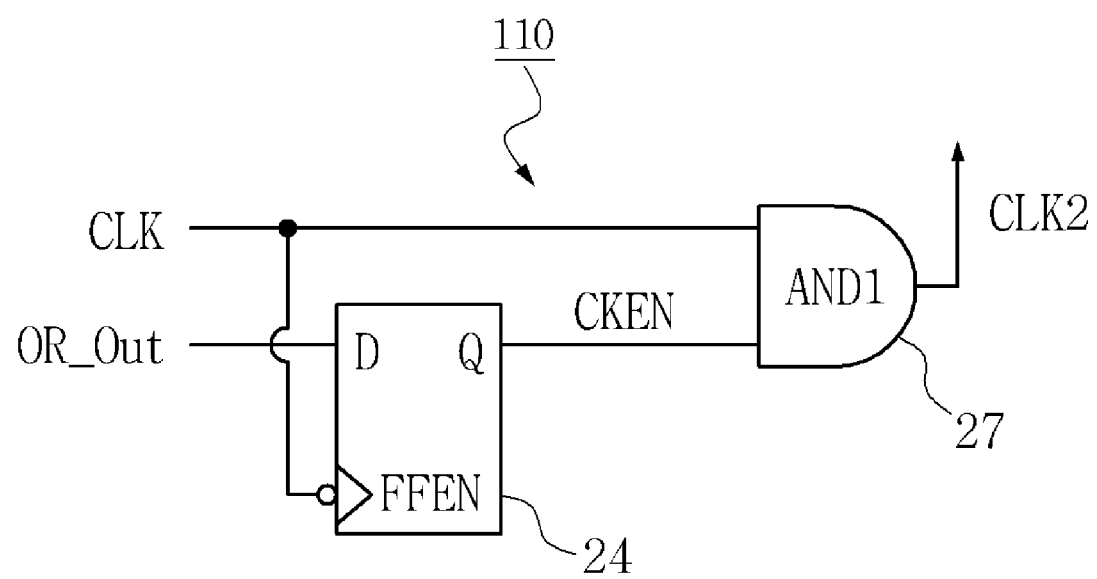
Figure 17:
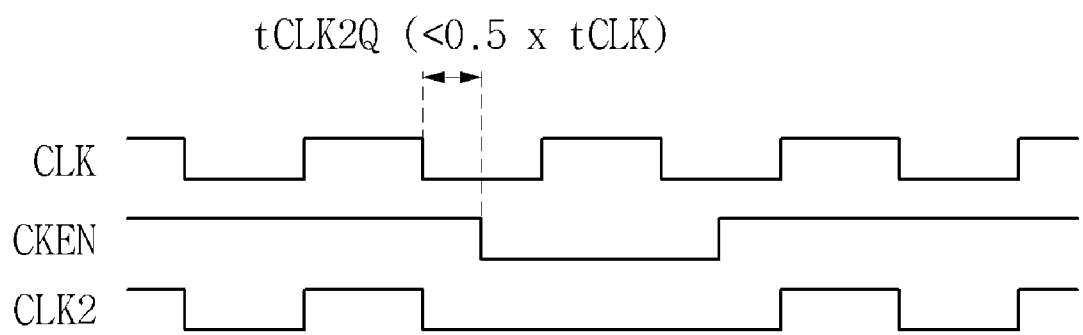

FIGS. 16, 17 and 18 are diagrams specifically illustrating a glitch-free clock gating scheme used in FIGS. 12 and 14. It is assumed that the clock-to-q delay (tCLK2Q) of the flip-flop 24 as a falling-edge triggered flip-flop is smaller than 0.5× tCLK. Here, q means the output of the flip-flop.

As shown in FIG. 17, if the condition "tCLK2Q<0.5× tCLK" is satisfied, change in the clock enable signal CKEN occurs only during a period in which the clock CLK is "L". Even when one of the two inputs of the AND gate 27 is "L", the output of the AND gate 27 is "L", so when the clock CLK is at "L", the second clock CLK2 is maintained "L" regardless of change in the clock enable signal CKEN. Further, during a period in which the clock enable signal CKEN is "L", the second clock CLK2 is constantly maintained "L". Consequently, if the circuit is configured as shown in FIG. 16 and the condition "tCLK2Q<0.5×tCLK" is satisfied, as shown in FIG. 17, glitch-free clock gating is possible.

As shown in FIG. 18, if the clock enable signal CKEN is changed during a period in which the clock CLK is "H", an undesired short pulse, that is, a glitch occurs in the second clock CLK2. However, if the circuit is configured as shown in FIG. 16 and the condition "tCLK2Q<0.5×tCLK" is satisfied, a glitch shown in FIG. 18 does not occur.

The above-description has been made for an example of implementation of a glitch-free power-saving mode and an active mode related to a shift register.

The shift register according to the embodiments of the inventive concept may be used as a latency control circuit in a semiconductor memory device including a memory cell array having a plurality of memory cells in a matrix of rows and columns and a read and write circuit reading data from the memory cells and writing data to the memory cells.

Such a latency control circuit controls read and write latency of the read and write circuit and internally has a power-down mode and a wake-up mode for power saving.

Although the embodiment of inventive concept has been described with reference to the drawings, it will be understood by those skilled in the art that various modifications or changes may be made within the scope of the inventive concept. For example, in some cases, the internal configuration or signal timing of the drive operation controller may be modified without departing from the technical spirit and scope of the inventive concept.

Although in the above-described embodiments, the DRAM has been described, the technical spirit of the inventive concept may be applied to a volatile semiconductor memory, such as a pseudo SRAM or the like.

What is claimed is:

1. A shift register capable of operating in a power-saving mode or an active mode, and comprising:
   a shift register including a plurality of flip-flops configured in series to shift input data in response to an applied clock; and
   a drive operation controller comprising:
   a first logic gate configured to receive and logically combine selected outputs from selected ones of the plurality of flip-flops to generate a gate output signal;
   a drive operation controller flip-flop configured to receive the gate output signal and retime the gate output signal in response to a first clock applied to a clock terminal of a first flip-flop in the plurality of flip-flops to generate a clock enable signal;
   an inverter configured to receive the clock enable signal and generate an inverted clock enable signal; and
   a second logic gate configured to receive and logically combine the first clock and the inverted clock enable signal to generate a second clock, wherein the second clock signal is applied to a clock terminal of at least one later stage flip-flop following the first flip-flop in the plurality of flip-flops.

2. The shift register of claim 1, wherein the at least one later stage flip-flop includes a last flop-flop series connected within the plurality of flip-flops.

3. The shift register of claim 1, wherein the first logic gate is a first OR gate and the selected outputs exclude a last output from the last flip-flop.

4. The shift register of claim 3, wherein the first logic gate is a first OR gate and the selected outputs include outputs from each one of the plurality of flip-flops except the last output from the last flip-flop.

5. The shift register circuit of claim 3, wherein the second logic gate is a second OR gate.

6. The shift register circuit of claim 3, wherein the second logic gate is an AND gate.

7. The shift register of claim 1, further comprising:
   an additional flip-flip series connected in front of the first flip-flop and configured to pass the input data to the first flip-flop, wherein the first logic gate is a first OR gate receiving as input selected outputs from the plurality of flip-flops, excluding a last output from a last flip-flop series connected within the plurality of flip-flops, and the input data.

8. The shift register circuit of claim 1, wherein each one of the plurality of flip-flops operates on a rising-edge of the applied clock.

9. The shift register circuit of claim 1, wherein each one of the plurality of flip-flops operates on a falling-edge of the applied clock.

10. A semiconductor memory device comprising:
   a memory cell array having a plurality of memory cells in a matrix of rows and columns;
   a read and write circuit configured to read data from the memory cells and write data to the memory cells; and
   a latency control circuit configured to control read latency for the read circuit and write latency for the write circuit when operating in a power-saving mode or an active mode, wherein the latency control circuit comprises:
   a shift register including a plurality of flip-flops configured in series to shift input data in response to an applied clock; and
   a drive operation controller comprising:
   a first logic gate configured to receive and logically combine selected outputs from selected ones of the plurality of flip-flops to generate a gate output signal;
   a drive operation controller flip-flop configured to receive the gate output signal and retime the gate output signal in response to a first clock applied to a clock terminal of a first flip-flop in the plurality of flip-flops to generate a clock enable signal;

an inverter configured to receive the clock enable signal and generate an inverted clock enable signal; and a second logic gate configured to receive and logically combine the first clock and the inverted clock enable signal to generate a second clock, wherein the second clock signal is applied to a clock terminal of at least one later stage flip-flop following the first flip-flop in the plurality of flip-flops.

11. The semiconductor memory device of claim 10, wherein the at least one later stage flip-flop includes a last flip-flop series connected within the plurality of flip-flops.

12. The semiconductor memory device of claim 10, wherein the first logic gate is a first OR gate and the selected outputs exclude a last output from the last flip-flop.

13. The semiconductor memory device of claim 12, wherein the first logic gate is a first OR gate and the selected outputs include outputs from each one of the plurality of flip-flops except the last output from the last flip-flop.

14. The semiconductor memory device of claim 12, wherein the second logic gate is a second OR gate.

15. The semiconductor memory device of claim 12, wherein the second logic gate is an AND gate.

16. The semiconductor memory device of claim 10, further comprising:

an additional flip-flop series connected in front of the first flip-flop and configured to pass the input data to the first flip-flop, wherein the first logic gate is a first OR gate receiving as input selected outputs from the plurality of flip-flops, excluding a last output from a last flip-flop series connected within the plurality of flip-flops, and the input data.

17. The semiconductor memory device claim 10, wherein each one of the plurality of flip-flops operates on a rising-edge of the applied clock.

18. The semiconductor memory device of claim 10, wherein each one of the plurality of flip-flops operates on a falling-edge of the applied clock.

\* \* \* \* \*